(12) United States Patent
Nikitin et al.

(10) Patent No.: US 8,980,687 B2
(45) Date of Patent: Mar. 17, 2015

(54) SEMICONDUCTOR DEVICE AND METHOD OF MANUFACTURING THEREOF

(75) Inventors: Ivan Nikitin, Regensburg (DE); Stefan Landau, Wehrheim (DE); Joachim Mahler, Regensburg (DE); Alexander Heinrich, Regensburg (DE); Ralf Wombacher, Burglengenfeld (DE)

(73) Assignee: Infineon Technologies AG, Neubiberg (DE)

( * ) Notice: Subject to any disclaimer, the term of this patent is extended or adjusted under 35 U.S.C. 154(b) by 429 days.

(21) Appl. No.: 13/369,075

(22) Filed: Feb. 8, 2012

(65) Prior Publication Data

US 2013/0200502 A1 Aug. 8, 2013

(51) Int. Cl.
*H01L 21/00* (2006.01)

(52) U.S. Cl.
USPC ........... 438/106; 438/107; 438/109; 438/113; 438/123; 438/127; 257/E21.499; 257/E21.502; 257/E21.503; 257/E21.506

(58) Field of Classification Search
None
See application file for complete search history.

(56) References Cited

U.S. PATENT DOCUMENTS

| 7,388,281 | B2 | 6/2008 | Krueger et al. | |
|---|---|---|---|---|
| 8,659,154 | B2 * | 2/2014 | Meyer et al. | 257/738 |
| 2010/0062563 | A1 * | 3/2010 | Pressel et al. | 438/106 |
| 2010/0207272 | A1 * | 8/2010 | Steiner et al. | 257/738 |
| 2011/0031602 | A1 | 2/2011 | Wowra et al. | |
| 2011/0108971 | A1 | 5/2011 | Ewe et al. | |
| 2011/0291252 | A1 | 12/2011 | Hosseini | |
| 2012/0273957 | A1 * | 11/2012 | Meyer | 257/773 |

FOREIGN PATENT DOCUMENTS

| DE | 10 2011 001 770 A1 | 12/2001 |
|---|---|---|
| DE | 10238523 A1 | 3/2004 |
| DE | 10 2010 017 768 A1 | 2/2011 |
| DE | 10 2010 038 154 A1 | 5/2011 |

* cited by examiner

*Primary Examiner* — Mohsen Ahmadi
(74) *Attorney, Agent, or Firm* — Slater & Matsil, L.L.P.

(57) ABSTRACT

A method of manufacturing a semiconductor device includes providing a transfer foil. A plurality of semiconductor chips is placed on and adhered to the transfer foil. The plurality of semiconductor chips adhered to the transfer foil is placed over a multi-device carrier. Heat is applied to laminate the transfer foil over the multi-device carrier, thereby accommodating the plurality of semiconductor chips between the laminated transfer foil and the multi-device carrier.

25 Claims, 9 Drawing Sheets

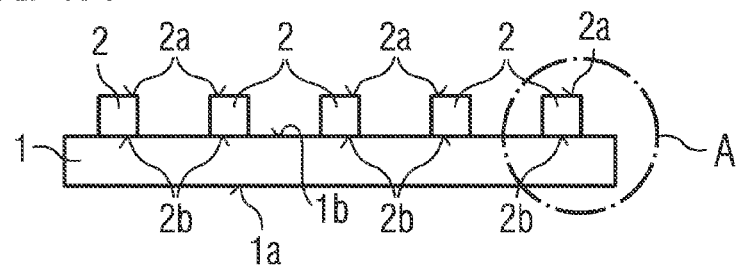
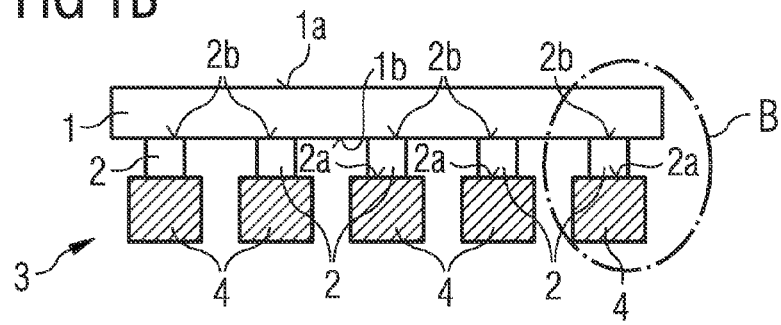
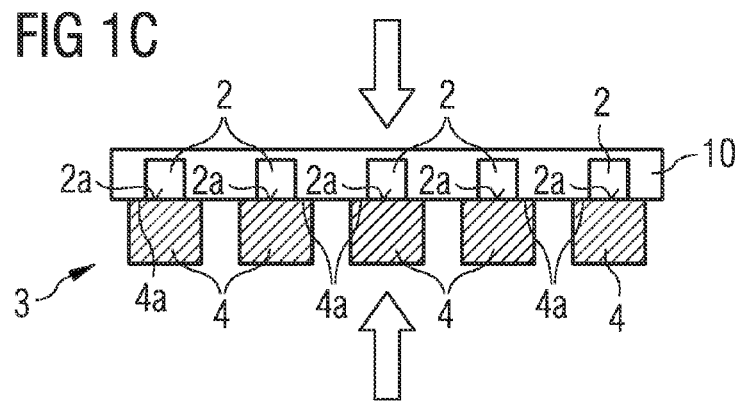
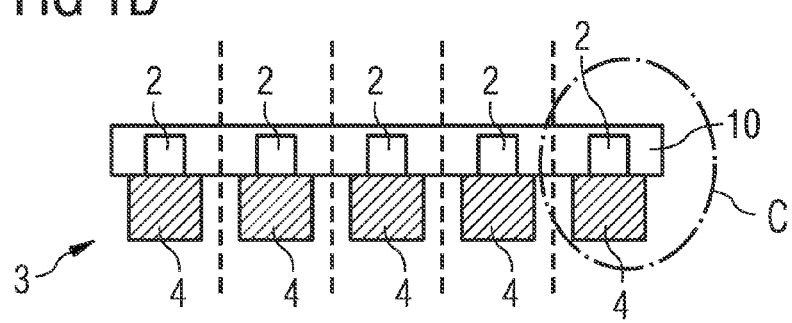

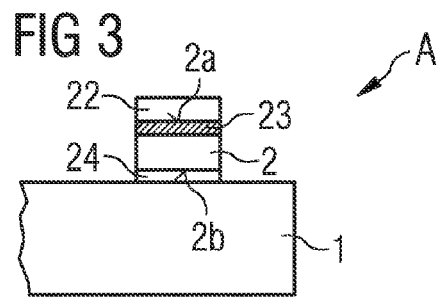
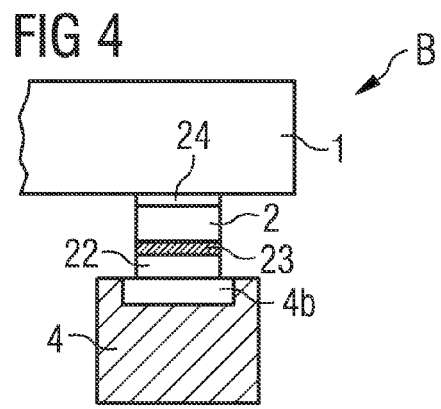
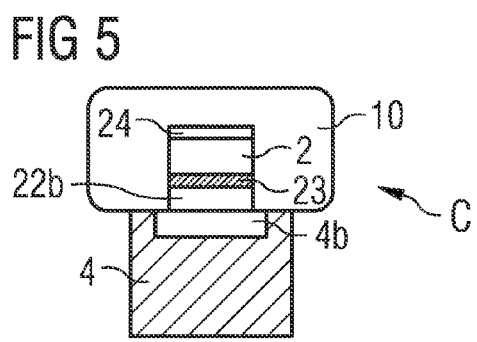
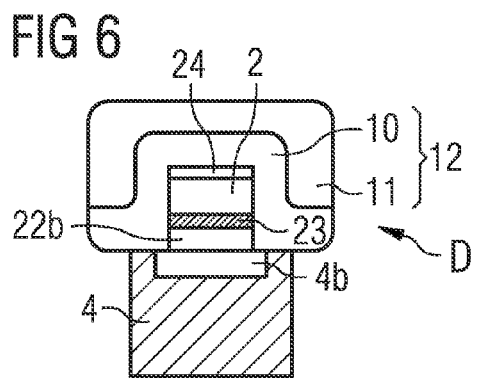

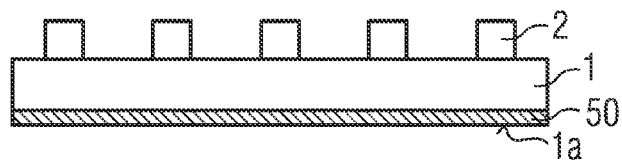
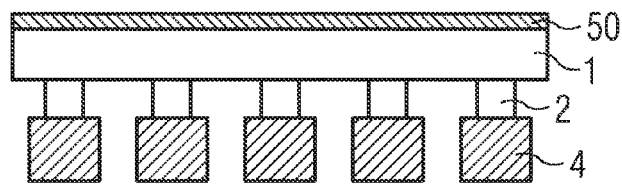
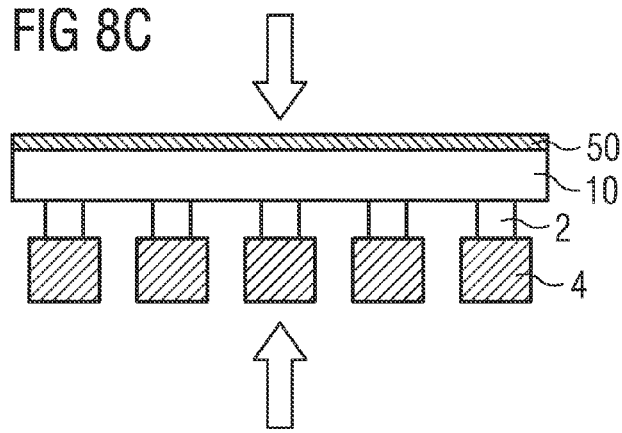
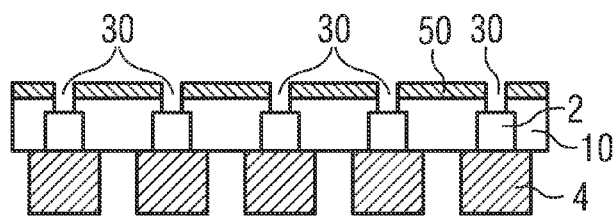
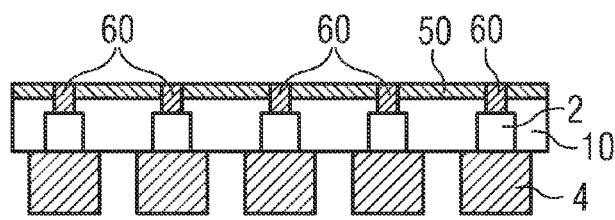

FIG 8F
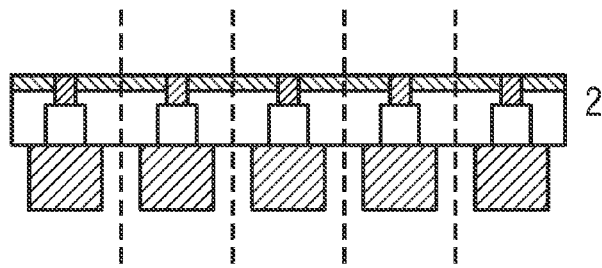
FIG 9A
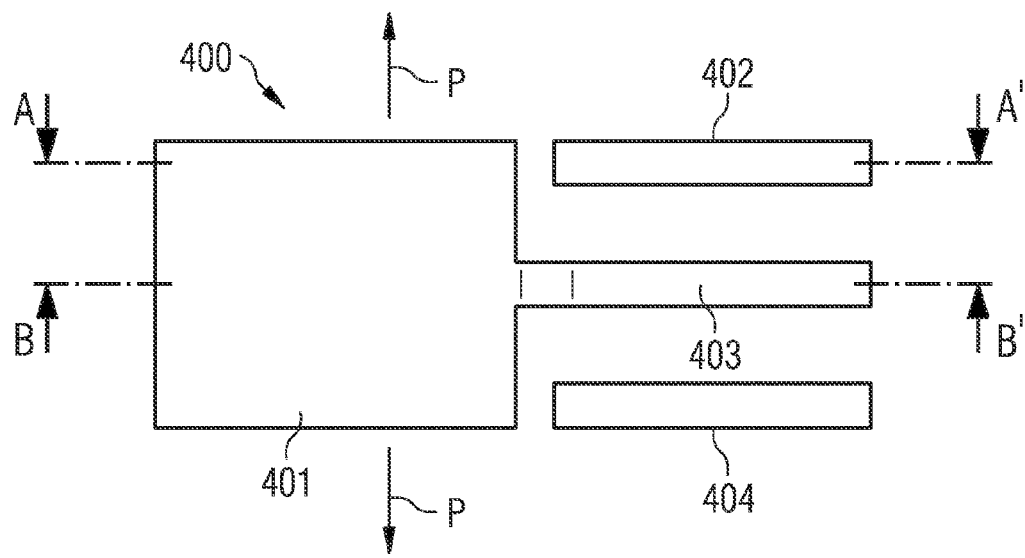
FIG 9B  A-A'
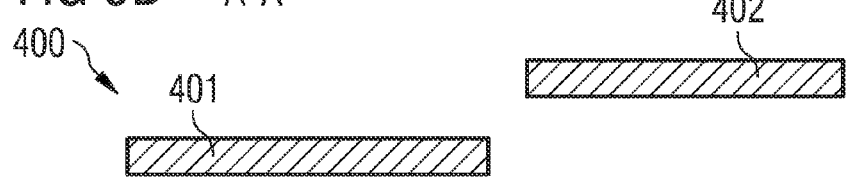
FIG 9C  B-B'
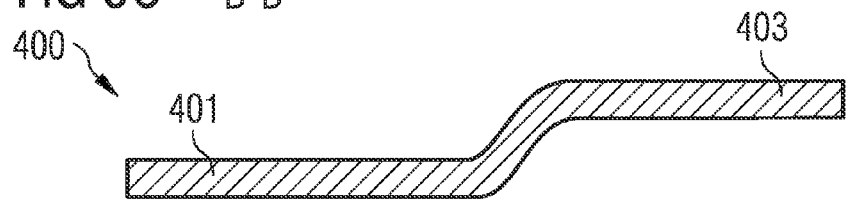

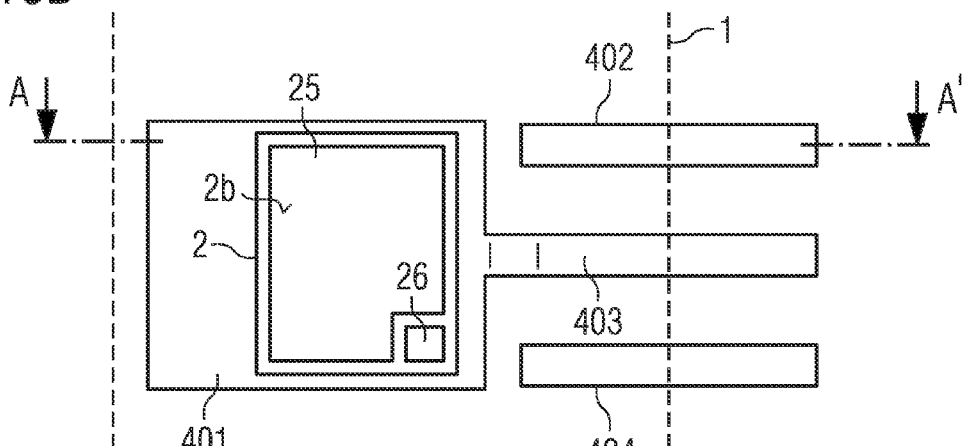
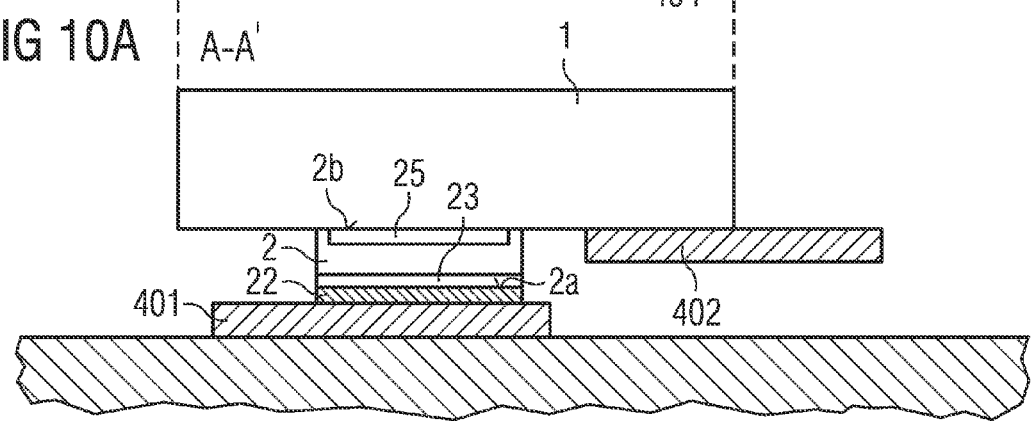
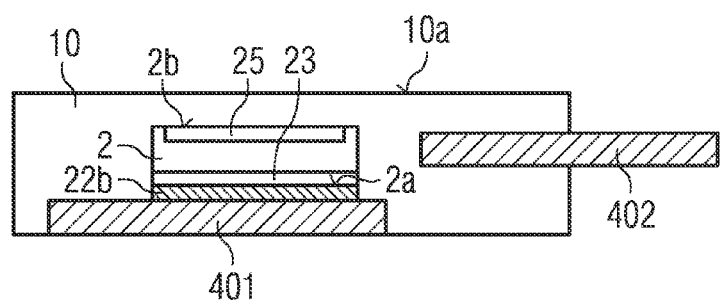

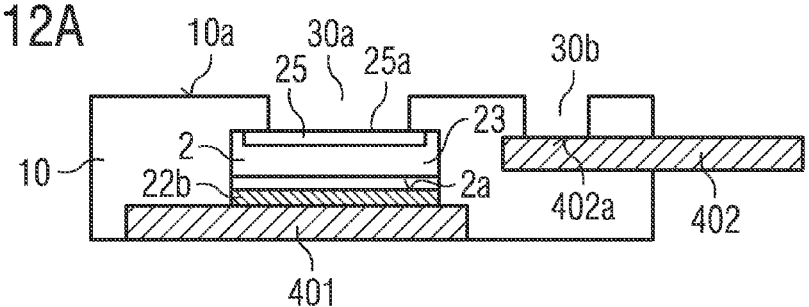
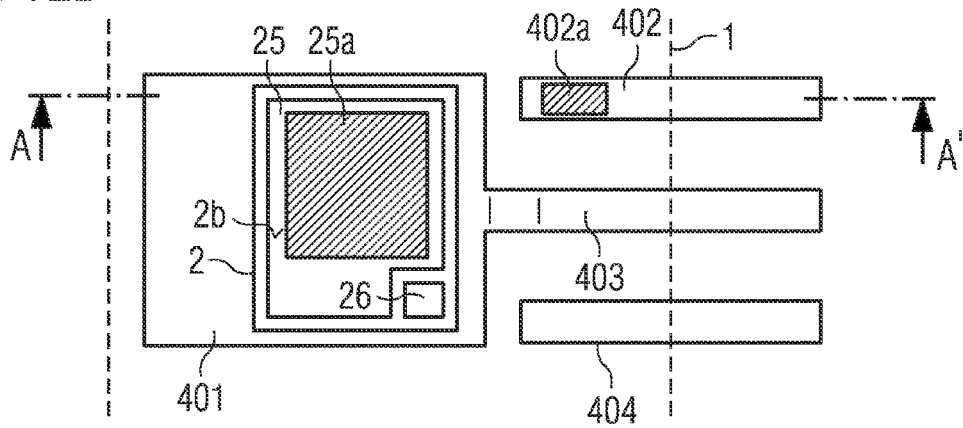
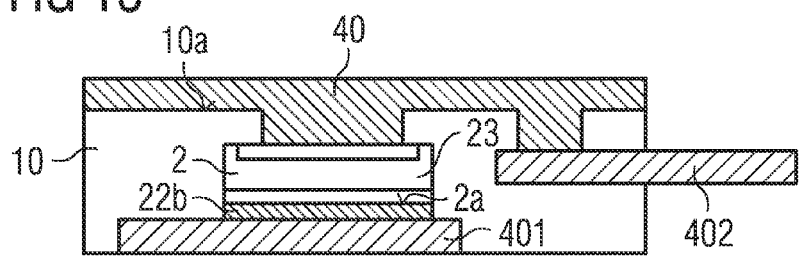
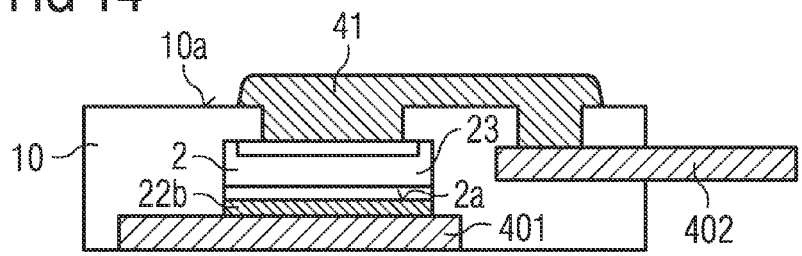

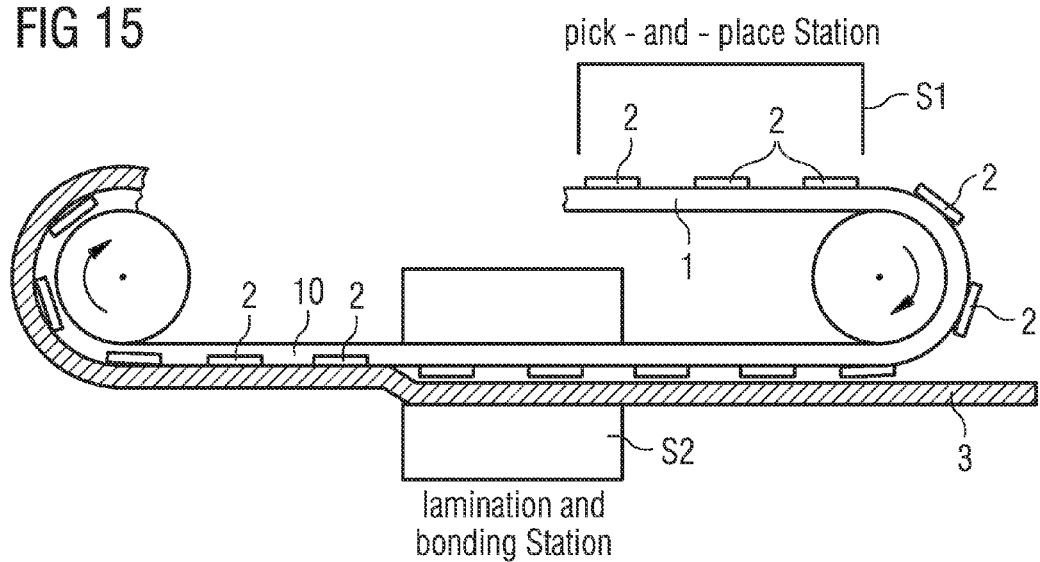
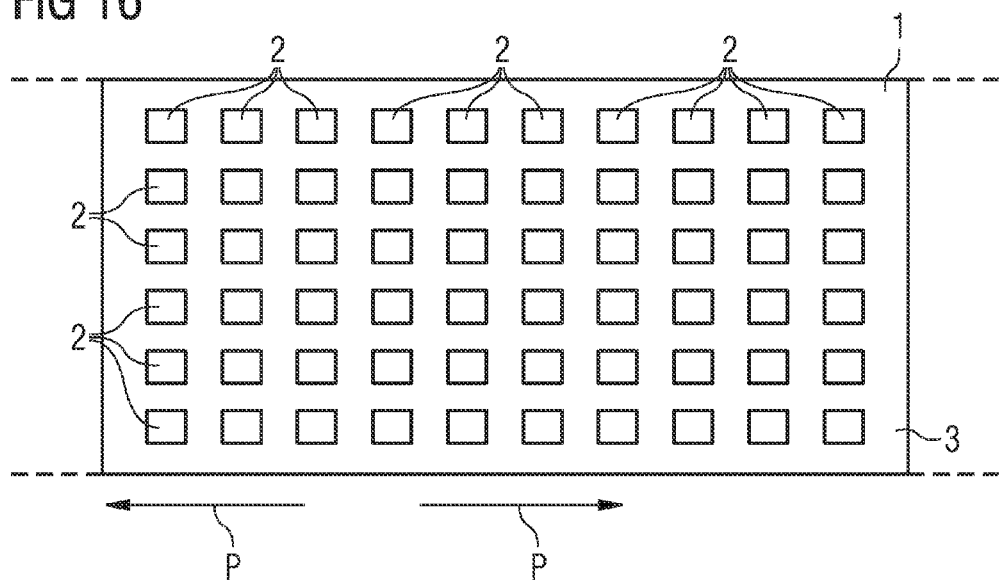

SEMICONDUCTOR DEVICE AND METHOD OF MANUFACTURING THEREOF

TECHNICAL FIELD

This invention relates to semiconductor devices, and more particularly to the technique of packaging a semiconductor device.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated on wafers, which are then singulated to produce semiconductor chips. One or more semiconductor chips are placed in a package to protect them from environmental and physical stresses. Packaging also involves electrically coupling the semiconductor chips to a carrier. Packaging methods providing high yield at low expenses are desirable.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 1A to 1D schematically illustrate a cross-sectional view of one embodiment of a method of manufacturing a semiconductor device;

FIG. 3 is a schematic illustration of an exemplary detail of the arrangement depicted in FIG. 1A in accordance with one embodiment;

FIG. 4 is a schematic illustration of an exemplary detail of the arrangement depicted in FIG. 1B in accordance with one embodiment;

FIG. 5 is a schematic illustration of an exemplary detail of the arrangement depicted in FIG. 1D in accordance with one embodiment;

FIG. 6 is a schematic illustration of an exemplary detail of the arrangement depicted in FIG. 2E in accordance with one embodiment;

FIGS. 8A to 8F schematically illustrate a cross-sectional view of one embodiment of a method of manufacturing a semiconductor device;

FIG. 9A schematically illustrates a top view of a leadframe in accordance with one embodiment of a method of manufacturing a semiconductor device;

FIG. 9B schematically illustrates a cross-sectional view along line A-A' of FIG. 9A;

FIG. 9C schematically illustrates a cross-sectional view along line B-B' of FIG. 9A;

FIG. 10A schematically illustrates a cross-sectional view corresponding to FIG. 9B after placing a semiconductor chip on the leadframe in accordance with one embodiment of a method of manufacturing a semiconductor device;

FIG. 10B schematically illustrates a top view of the arrangement as shown in FIG. 10A, assuming a transparent adhesive foil;

FIG. 11 schematically illustrates a cross-sectional view corresponding to FIG. 10A after laminating an adhesive foil over the semiconductor chip and the leadframe in accordance with one embodiment of a method of manufacturing a semiconductor device;

FIG. 12A schematically illustrates a cross-sectional view corresponding to FIG. 11 after generating holes in an encapsulant formed by the adhesive foil in accordance with one embodiment of a method of manufacturing a semiconductor device;

FIG. 12B schematically illustrates a top view of the arrangement as shown in FIG. 12A, assuming a transparent adhesive foil;

FIG. 13 schematically illustrates a cross-sectional view corresponding to FIG. 12A after depositing a conducting layer on the encapsulant in accordance with one embodiment of a method of manufacturing a semiconductor device;

FIG. 14 schematically illustrates a cross-sectional view corresponding to FIG. 13 after structuring the conducting layer in accordance with one embodiment of a method of manufacturing a semiconductor device;

FIG. 15 schematically illustrates a cross-sectional view of a reel-to-reel process in accordance with one embodiment of a method of manufacturing a semiconductor device; and FIG. 16 schematically illustrates a top view on a multi-device carrier with semiconductor chips bonded thereon, assuming a transparent encapsulant.

DETAILED DESCRIPTION OF ILLUSTRATIVE EMBODIMENTS

Figure 2A:
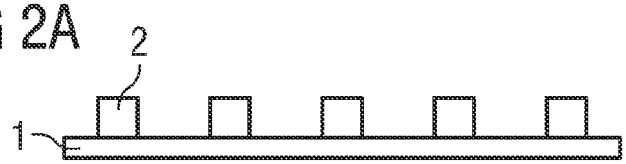
FIGS. 2A to 2E schematically illustrate a cross-sectional view of one embodiment of a method of manufacturing a semiconductor device.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing one or more semiconductor chips are described below. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, magnetic field sensors, electro-magnetic field sensors, microphones, etc. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure has electrodes on its two main surfaces, that is to say on its top side and bottom side. In particular, power semiconductor chips may have a vertical structure. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of power semiconductor chips.

The semiconductor chips may have electrodes (or contact elements or contact pads) which allow electrical contact to be made with the integrated circuits included in the semiconductor chips. The electrodes may include one or more metal layers that are applied to the semiconductor material. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor chips may be placed on a multi-device carrier. Various multi-device carriers may be used, e.g., leadframes, a ceramic substrate, a PCB (Printed Circuit Board), a plastic panel, a DCB (Direct Copper Bond), which is a ceramic substrate with copper layers on its top and bottom surface, etc. The multi-device carrier may, e.g., comprise electrically conducting pads on which the semiconductor chips are placed and electrically interconnected.

By way of example, leadframes may be used as a specific type of a multi-device carrier. The leadframes may be of any shape, size and material. The leadframes may include die pads and leads. During the fabrication of the devices the die pads and leads may be connected to each other. The die pads and leads may also be made from one piece. The die pads and leads may be connected among each other by connection means with the purpose of separating some of the die pads and leads in the course of the fabrication. Separation of the die pads and leads may be carried out by mechanical sawing, a laser beam, cutting, stamping, milling, etching or any other appropriate method. The leadframes may be electrically conductive. They may be entirely fabricated from metals or metal alloys, in particular copper, copper alloys, iron nickel, aluminum, aluminum alloys, steel, stainless steel or other appropriate materials. The leadframes may be plated with an electrically conductive material, for example, copper, silver, iron nickel or nickel phosphorus. The leads of the leadframes may be bent during fabrication, for example, in an S-shaped manner.

The semiconductor devices described herein may include external contact elements (or external contact pads), which may be of any shape and size. The external contact elements may be accessible from outside the device and may thus allow electrical contact to be made with the semiconductor chips from outside the device. For this reason, the external contact elements may have external contact surfaces which can be accessed from outside the device. Furthermore, the external contact elements may be thermally conductive and may serve as heat sinks for dissipating the heat generated by the semiconductor chips. The external contact elements may be composed of any desired electrically conductive material, for example, of a metal, such as copper, aluminum or gold, a metal alloy or an electrically conducting organic material. By way of example, if leadframes are used as a multi-device carrier, some of the external contact elements may be leads of a leadframe.

The semiconductor devices described herein include an encapsulant covering at least parts of the semiconductor chip. The semiconductor devices are manufactured by using an adhesive foil, with semiconductor chips placed on the adhesive foil, and by laminating the adhesive foil over the multi-device carrier. Thus, the encapsulant of the semiconductor device at least partly includes an encapsulation material provided by the adhesive foil. The adhesive foil may comprise an encapsulation material made of one or more of, e.g., epoxy, acrylate or polyimide. Specific examples of materials which may be used for the adhesive foil are PEEK (polyetheretherketone), PPS (polyphenylsulphone), PSU (polysulfone), PEI (polyetherimide), PAI (polyamidimide) and LCP (liquid crystalline polymers).

The adhesive foil may comprise a polymer of a B-stage material as an encapsulation material. B-stage materials are uncured materials which soften when heated, but may not completely fuse or dissolve. By way of example, an uncured epoxy material may form a B-stage material.

The semiconductor chips may be mechanically and electrically connected to the multi-device carrier during laminating the adhesive foil over the multi-device carrier. Various processes, such as, e.g., soldering or sintering may be applied to mechanically and electrically connect semiconductor chip electrodes to electrically conducting pads of the multi-device carrier (e.g., to die pads of a leadframe).

The semiconductor chips may be mechanically and electrically connected to the multi-device carrier via bond layers. In one embodiment, the bond layers may be made of diffusion solder. If diffusion soldering is used as a connecting technique, solder materials are used which lead to intermetallic phases after the end of the soldering operation at the interfaces between the electrodes of the semiconductor chips, the diffusion solder bond layer and the electrically conducting pads on the multi-device carrier on account of interface diffusion processes. By way of example, AuSn, AgSn, CuSn, AgIn, AuIn, CuIn, AuSi, Sn or Au solders may be used as a solder material.

In one embodiment, the bond layers may be made of a sintered metal structure, i.e., of metal particles electrically contacting to each other. Such bond layers comprising metal particles may, e.g., be prepared by applying a deposit of a vaporizable paste comprising metal particles, such as, e.g., copper or silver, to the chip electrodes and/or the electrically conductive pads of the multi-device carrier and by applying heat to vaporize the paste and to sinter the particles contained in the paste. By way of example, nano pastes may be used. Nano pastes consist of metal particles having dimensions in the nanometer range. During application the metal particles may be dispersed in a solvent (paste) which evaporate later on during application of heat. The metal particles are thereby sintered to create electrically conductive connections.

Using diffusion solder or sintered metal particles for bonding the semiconductor chips to the multi-device carrier allows for generating bond layers of small thickness. That way, it is possible to produce bond layers which have a thickness of less than 50 μm, in particular less than 20 μm or even less than 10 μm. Still further, using diffusion solder or sintered metal particles for bonding the semiconductor chips to the multi-device carrier allows for creating bond connections which are highly temperature resistant. Thus, these bond connections do not degrade or fail in the case of subsequent heating such as, e.g., accomplished in a solder reflow process for soldering the semiconductor device to a board (e.g., at about 260° C.).

FIGS. 1A-1D exemplify stages of fabrication of a semiconductor device in accordance with some embodiments. As illustrated in FIG. 1A, an adhesive foil 1 is provided. The adhesive foil has a first surface 1a and a second surface 1b opposite to the first surface 1a.

The adhesive foil 1 may, e.g., be a sticky tape, i.e., a tape having a sticky second surface 1b. It may also be a double sided sticky tape having a sticky first surface 1a and a sticky second surface 1b. In one embodiment a glue material or any other adhesive material or a mechanical securing means may be associated with the second surface 1b of the adhesive foil 1.

Still referring to FIG. 1A, a plurality of semiconductor chips 2 may be placed on the second surface 1b of the adhesive foil 1. Chip placement on the adhesive foil may be accomplished by common pick-and-place equipment. Placing the semiconductor chips 2 on the adhesive foil 1 may be monitored and controlled by an appropriate monitoring/control system, e.g., by a visual monitoring/control system such as, e.g., a camera. Positioning accuracy as high as 10 μm or better (e.g., positional tolerances equal or smaller than 5 μm) may be obtained.

As known in the art, semiconductor chips 2 are fabricated on wafers. In one embodiment semiconductor chips 2 of different chip designs may be placed on the adhesive foil 1. In another embodiment semiconductor chips 2 of the same chip design may be placed on the adhesive foil 1.

As known in the art, with the plurality of semiconductor chips 2 attached to the adhesive foil 1, the adhesive foil 1 may be used as a transfer foil to move the semiconductor chip 2 from one location or station to another location or station.

The adhesive foil 1 may have an elongated shape, e.g., a shape of a tape. In this case, the longitudinal direction of the adhesive foil (tape) 1 is shown in FIG. 1A to extend in the direction from right to left. In one embodiment, one row of semiconductor chips 2, such as, e.g., shown in FIG. 1A, may be placed along the longitudinal extension of the adhesive foil 1. In another embodiment, multiple rows of semiconductor chips 2 may be placed next to one another (relating to a direction perpendicular to the longitudinal direction) on the adhesive foil 1. In this case, the semiconductor chips 2 are placed in a two-dimensional array on the adhesive foil 1.

The adhesive foil 1 may be made of an uncured resin such as an uncured epoxy, acrylate or polyimide material. Further, the adhesive foil may be made of a thermoplastic material that fuses at temperatures far over 200° C., such as, e.g., PEEK, PPS, PSU, PEI, PAI and LCPs.

Each semiconductor chip 2 may have a first main surface 2a and a second main surface 2b. The semiconductor chips 2 are placed on the adhesive foil 1 with the second main surface 2b facing the adhesive foil 1. In some embodiments the second main surface 2b may be the active surface of the semiconductor chips 2. Further, the second main surface 2b of the semiconductor chips 2 may be equipped with chip electrodes (not depicted in FIGS. 1A-1D) to make electrical contact with an integrated circuit implemented in each semiconductor chip 2.

After adhering the semiconductor chips 2 to the adhesive foil 1, the adhesive foil 1 with semiconductor chips 2 may be transferred to a multi-device carrier 3. By way of example, transferring the adhesive foil 1 from a pick-and-place location or station, as shown in FIG. 1A, to a location or station where the multi-device carrier 3 is provided may comprise moving the adhesive foil 1 in a spatial direction and/or flipping the adhesive foil 1 from one side to the other side (see, e.g., FIGS. 1A and 1B). Thus, the adhesive foil 1 may be used to transfer or manipulate an array of semiconductor chips 2 in a bunch process. Such foil is therefore referred to as a transfer foil (or transfer tape) in the art.

As shown in FIG. 1B, each semiconductor chip 2 may be placed on a specific carrier 4 of the multi-device carrier 3. Each carrier 4 of the multi-device carrier 3 may eventually define a carrier of one finalized semiconductor device (see FIG. 1D). Depending on the number of semiconductor chips per device, one or more semiconductor chips 2 may be placed on each carrier 4 of the multi-device carrier 3.

Depending on the nature of the multi-device carrier 3, the (device) carriers 4 may be connected to each other or separated from each other. By way of example, the multi-device carrier 3 may, e.g., be a leadframe, a DCB, a PCB, etc. Each carrier 4 may be a die pad of the multi-device carrier 3 (e.g., a die pad of a leadframe). Die pads of a leadframe are separated from each other and only connected by a frame structure of the leadframe. In other embodiments the (device) carriers 4 are, at this stage of the process, still integral, e.g., may be configured to be predetermined zones of the sheet-like multi-device carrier 3 such as, e.g., a PCB. In this case, these carriers 4 (or zones of the multi-device carrier 3) are separated at a later stage of the process (see FIG. 1D) to provide separate carriers 4 of single devices.

In FIG. 1C the adhesive foil 1 is laminated over the multi-device carrier 3 to form an encapsulant 10 accommodating the semiconductor chips 2. In other words, the side faces and/or the first main surfaces 2a of the semiconductor chips are partly or completely covered by the encapsulant 10.

The lamination and formation of the encapsulant 10 may be assisted by heat and pressure. The direction of pressure is indicated by the arrows shown in FIG. 1C.

Heating of the adhesive foil 1 results in that the adhesive foil 1 becomes liquid and fills the gaps between the semiconductor chips 2. Filling of the gaps between the semiconductor chips 2 is promoted by the (optional) pressure applied to the adhesive foil 1 as indicated by the arrows.

Before heating, the adhesive foil 1 is in an uncured state. Further heating of the adhesive foil 1 as shown in FIG. 1C may result in that the material of the adhesive foil 1 cures. Thus, the encapsulant 10 comprises the cured encapsulation material of which the adhesive foil 1 is made. In other words, additional to the use of the adhesive foil 1 as a transfer foil, the adhesive foil 1 is used to provide encapsulation material for encapsulating or packaging the semiconductor chips 2. Laminating the adhesive foil 1 to the multi-device carrier 3 by applying heat and (optionally) pressure may result in a planar upper surface of the encapsulant 10.

Further, the semiconductor chips 2 may be electrically connected and/or mounted to the (device) carriers 4 of the multi-device carrier 3. Electrically connecting of the semiconductor chips 2 to the carriers 4 may also be accomplished by the application of heat and (optional) pressure, e.g., heat and pressure which are applied during the lamination process in order to fuse the encapsulation material of the adhesive foil 1.

A number of bonding means, which are reactive to heat to establish an electrical and mechanical connection, are known in the art. By way of example, a soldering technique or a sintering process may be used. In both cases a deposit of a bonding substance (not shown), such as, e.g., a solder material, a metal particle paste, etc., has been applied beforehand either on the first main surfaces 2a of the semiconductor chips 2 or on upper surfaces 4a of the carriers 4 or on both of these surfaces. Then, e.g., during the application of the heat used for melting or optionally for curing the encapsulation material of the adhesive foil 1, the bonding substance may generate an electrically conducting connection between the semiconductor chips 2 and the carriers 4, respectively. That way, the semiconductor chips 2 may be fixedly secured or mounted to the carriers 4. Thus, the process of mounting the semiconductor chips 2 to the multi-device carrier 3 is decoupled from the pick-and-place process (i.e., is carried out later and at another station).

In some embodiments the melting temperature of the encapsulation material may be higher than a transition temperature of the bonding substance at which the electrically conducting connection is established. That is, when heating the arrangement as shown in FIG. 1B, the electrically conducting connections (i.e., the bonding connections) between the semiconductor chips 2 and the carriers 4 are established first and then the encapsulation material of the adhesive foil 1 starts to melt. In this case, liquid encapsulation material may not flow or drag under the chip electrodes (not shown) located at the first main surface 2a of the semiconductor chips 2, and could therefore not impede or prevent bonding of the semiconductor chips 2 to the carriers 4 (because the bond is already established at the time the encapsulation material starts melting). By way of example, the transition temperature of the bonding substance may, e.g., be the melting temperature of solder or the sintering temperature of metal particles contained in a vaporizable paste or solvent.

In some embodiments it may also be possible that the transition temperature of the bonding substance may be equal or greater than the melting temperature of the encapsulation material. In this case, other measures such as, e.g., the application of sufficiently high pressure may be used to avoid bonding problems.

By way of example, if a sintered bonding connection is made, the bonding substance may contain metal particles distributed in a solvent made of a polymer material such as, e.g., α-terpineol. Such bonding substances or pastes containing metal particles can be, for example, purchased from the companies Coocson Electronic (product name: N 1000), Advanced Nano-Particles (ANP), Harima Chemicals (product names: NPS-H and NHD-1) or NBE Technologies (product name: NBE Tech). The metal particles may, for example, be made of silver, gold, copper, tin or nickel. The extensions (average diameter) of the metal particles may be smaller than 100 nm and, in particular, smaller than 50 nm or 10 nm. Therefore, these pastes are referred to as nano pastes in the art.

During sintering the metal particles, the solvent vaporizes. Thus, the solvent can later be detected as a contamination in the encapsulant 10. Therefore, according to one embodiment, the encapsulant 10 is contaminated by a solvent of the sintered material.

In FIG. 1D the encapsulant 10 and the multi-device carrier 3 may be divided into single devices as indicated by the dashed lines. Separation into the single devices may be carried out by mechanical sawing, laser beam sawing, cutting, stamping, milling, etching or any other appropriate method. Thus, the lamination step illustrated in FIG. 1C solely using the adhesive foil 1 may be the sole chip encapsulation step that is performed to reach the finalized, packaged semiconductor device.

It is to be noted that each of the processes described herein in conjunction with FIGS. 1A-1D may be accomplished in a semi-continuous manner. That is, each process may be carried out in parallel on a given number or bunch of semiconductor chips 2, and may be carried out on the same number of new semiconductor chips 2 at a later stage of the process. By way of example, pick-and-place as shown in FIG. 1A may be repeatedly carried out in parallel on a first number or bunch of semiconductor chips 2. Similarly, lamination and bonding as shown in FIG. 1A may be repeatedly carried out in parallel on a second number or bunch of semiconductor chips 2, wherein each bunch of semiconductor chips 2 is attached to different regions of the adhesive foil 1. A specific example of a semi-continuous process will be described further below in conjunction with FIGS. 15 and 16.

FIGS. 2A-2E exemplify stages of a manufacturing a semiconductor device in accordance with one embodiment. The process of FIGS. 2A-2E is similar to the process described above, and reference is made to the description above in order to avoid reiteration.

FIG. 2A illustrates by way of example semiconductor chips 2 placed on an adhesive foil 1 as explained in conjunction with FIG. 1A. However, different from the embodiment shown in FIGS. 1A-1D, the adhesive foil 1 used in the embodiment exemplified in FIGS. 2A-2E may be thinner than the adhesive foil 1 used in the embodiment exemplified by FIGS. 1A-1D. More particularly, wherein in the first embodiment of FIGS. 1A-1D, the (uncured) adhesive foil 1 of FIG. 1A may have a thickness larger than the thickness (height) of the semiconductor chips 2, the (uncured) adhesive foil 1 of FIG. 2A used in the second embodiment of FIGS. 2A-2E may have a thickness smaller than the thickness (height) of the semiconductor chips 2. In both cases, depending on the thickness of the semiconductor chips 2, the thickness of the adhesive foil 1 may, e.g., be greater than 100 μm, 300 μm or 500 μm.

Figure 2B:
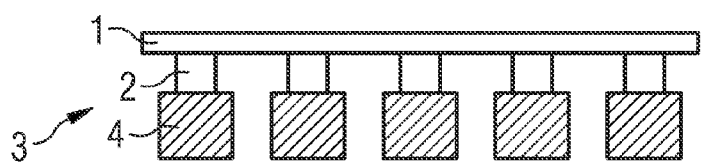

The process depicted in FIG. 2B may correspond to the process described in conjunction with FIG. 1B.

Figure 2C:
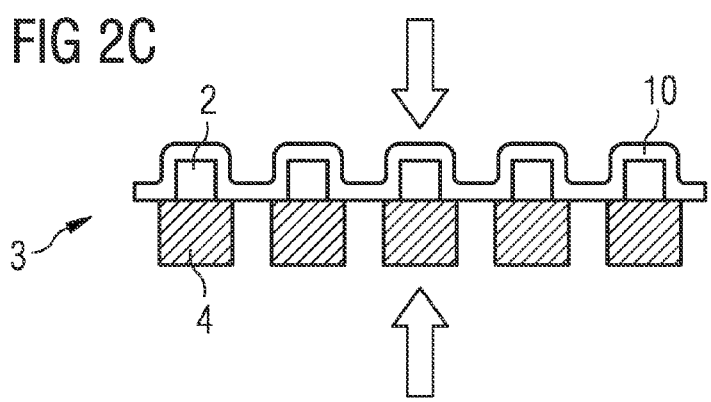

The process depicted in FIG. 2C may correspond to the process described in conjunction with FIG. 1C. However, as illustrated in FIG. 2C, the encapsulating material provided by the adhesive foil 1 may not suffice to completely fill the gaps between the semiconductor chips 2. Therefore, laminating the adhesive foil 1 to the multi-device carrier 3 by applying heat and (optionally) pressure may not result in a planar upper surface of the encapsulant 10.

Figure 2D:
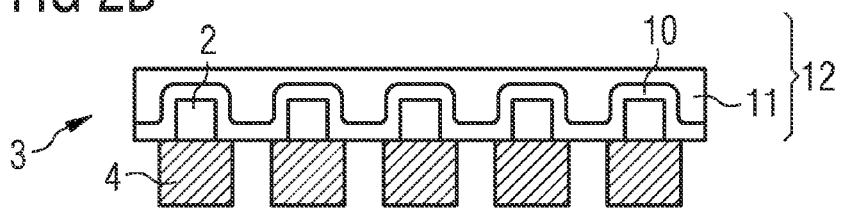

For these or other reasons the encapsulant 10 may be over-molded by a molding material 11. The molding material 11 may be different from the encapsulation material provided by the adhesive foil 1. In other words, as shown in FIG. 2D, a compound encapsulation body 12 comprising a plurality of materials (encapsulation material, molding material 11, etc.) may be formed. The molding material 11 may be chosen to provide a high degree of protection against mechanical, chemical or other forms of environmental attacks, to provide a package of high mechanical stability, to provide appropriate CTE (coefficient of thermal expansion) for lowering thermal stress and enhancing life time, and for other reasons. Various techniques may be employed for over-molding, for example, compression molding, injection molding, powder molding, liquid molding, dispensing or laminating.

Figure 2E:
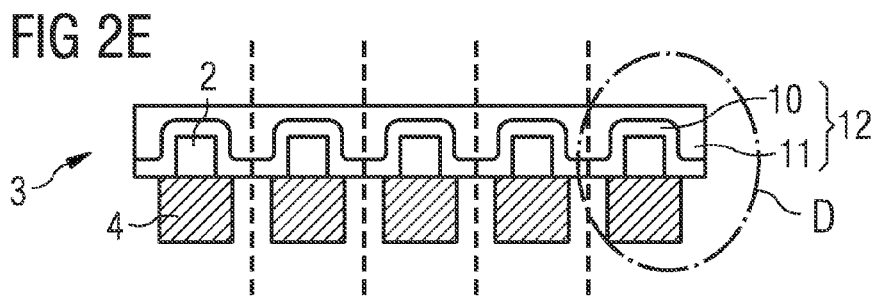

In FIG. 2E the compound encapsulation body 12 may be separated into single semiconductor devices by, e.g., using the same techniques as described above in conjunction with FIG. 1D.

In both embodiments of FIGS. 1A-1D and 2A-2E the film material of the adhesive foil 1, in view of the thickness thereof, is used for the encapsulant 10. However, it may also be the case that the adhesive foil 1 may comprise multiple layers and that only one of these layers is subsequently used to form the encapsulant 10.

FIG. 3 illustrates, by way of example, the detail A of FIG. 1A. A chip electrode 23 may be provided at the first main surface 2a of the semiconductor chip 2. A deposit of bonding substance 22 may be attached to the chip electrode 23. Further, the second main surface 2b of the semiconductor chip 2 may be glued to the upper surface of the adhesive foil 1 by a layer of adhesive material 24 covering the second main surface 2b of the semiconductor chip 2. As mentioned above, in other embodiments a layer of adhesive material may be coated to the upper surface of the adhesive foil 1.

FIG. 4 illustrates, by way of example, the detail B of FIG. 1B. At that stage of the manufacturing process the deposit of bonding substance 22 is placed on a device carrier 4. The device carrier 4 may, e.g., be a die pad of a leadframe or may, e.g., be a substrate which comprises a conductor pad or conductor track 4b to which the semiconductor chip 2 is to be connected.

FIG. 5 illustrates, by way of example, the detail C of FIG. 1D, i.e., a semiconductor device in accordance with one embodiment. The encapsulation material of the adhesive foil 1 has been cured or otherwise transformed to obtain the encapsulant 10. Reference numeral 22b relates to a bonding connection between conductor pad or conductor track 4b and chip electrode 23. The bonding connection has been generated from the deposit of bonding substance 22.

FIG. 6, by way of example, illustrates the detail D of FIG. 2E, i.e., a semiconductor device in accordance with one embodiment. As mentioned above, the compound encapsulation body 12 may comprise at least one further dielectric material such as, e.g., molding material 11. It is to be noted that molding material 11 may not necessarily be applied by a molding process, but may also be applied by other processes such as, e.g., another lamination process.

FIGS. 7A-7D exemplify stages of a process for manufacturing a semiconductor device. Aspects of the processes described in conjunction with FIGS. 7A-7D may be combined with processes described in the aforementioned embodiments, and vice versa.

Starting from an arrangement as, e.g., shown in FIG. 1C (or, equivalently, as shown in FIG. 2C), holes may be generated in an upper surface 10a of the encapsulant 10. The holes 30 may be configured to expose at least portions of the second main surface 2b of the semiconductor chips 2. By way of example, the holes 30 may expose, e.g., chip electrodes (not shown) of the semiconductor chip 2 extending on the second main surface 2b under the holes 30. In several embodiments, for each semiconductor chip 2, a plurality of holes 30 associated with a plurality of chip electrodes may be structured.

The holes 30 may be generated by drilling such as, e.g., mechanical drilling or laser drilling. Another possibility is to use a chemical process (photolithography, etching) in order to produce the holes 30. Further, it may also be possible to introduce the holes 30 at an earlier stage of the fabrication process, e.g., during the lamination step as shown in FIG. 1C. In this case, an upper pressure plate may be equipped with rods or blades or any elements having a positive shape of the holes 30.

After structuring the encapsulant 10, a conductive layer 40 may be applied to the upper surface 10a of the encapsulant 10. The conductive layer 40 may be applied by a plating process, e.g. by galvanic plating or electroless plating. If a galvanic plating process is used, a seed layer (not shown) may be deposited onto the upper surface 10a of the encapsulant 10 and in the holes 30. The seed layer may have a thickness of, e.g., up 1 μm and may, for example, be made of zinc. The seed layer is employed as an electrode, and copper or other metals or metal alloys may then be plated onto the seed layer to the desired height. The copper layer may virtually have any desired height depending on the application and current requirements. By way of example, the thickness of the conductive layer 40 may be in a range between 50 μm and 200 μm. Alternatively, electroless plating may be used to generate the conductive layer 40. Electroless plating is also referred to as chemical plating in the art. Further, other deposition methods such as physical vapor deposition (PVD), chemical vapor deposition (CVD), sputtering, spin-on processes, spray deposition or printing such as, e.g., ink-jet printing may be employed to form the conductive layer 40.

Figure 7A:
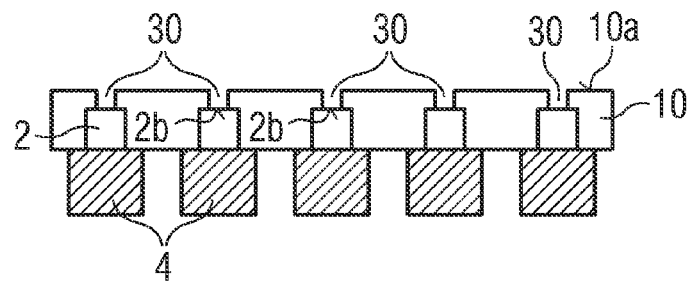
FIGS. 7A to 7D schematically illustrate a cross-sectional view of one embodiment of a method of manufacturing a semiconductor device.
Figure 7B:
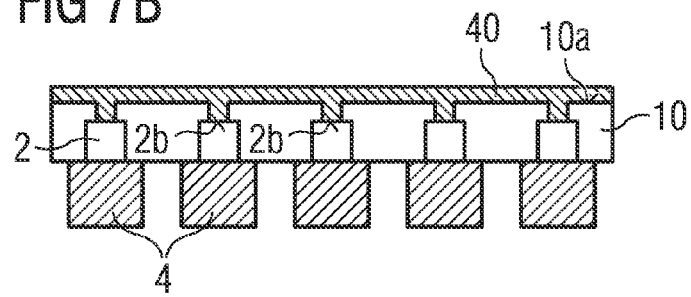
Figure 7C:
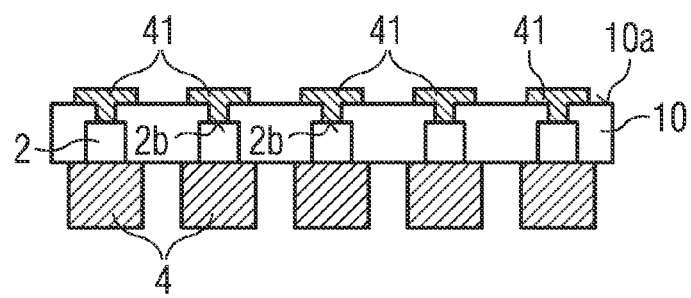

During fabrication or after fabrication the conductive layer 40 may be structured to obtain an arrangement as shown in FIG. 7C. Structuring of the conductive layer 40 may result in a plurality of device electrodes 41 located at the upper surface 10a of the encapsulant 10. Multiple device electrodes 41 per semiconductor device (see FIG. 7D) may be generated. Each device electrode 41 may electrically connect to a chip electrode (not shown) at the second main surface 2b of the semiconductor chip 2.

FIGS. 8A-8F exemplify stages of a process of manufacturing a semiconductor device as e.g. shown in FIG. 8F. According to FIG. 8A, semiconductor chips 2 are placed on an adhesive foil 1. To avoid reiteration, reference is made to FIG. 1A or 2A and the corresponding detailed disclosure. In FIG. 8A, however, the first surface 1a of the adhesive foil 1 is established by a conductive foil layer 50. In other words, the adhesive foil 1 is a multi-layer foil comprising at least one electrically conductive layer, namely conductive foil layer 50.

The process illustrated in FIG. 8B corresponds to the disclosure of FIG. 1B or 2B, to which reference is made to avoid reiteration.

The process illustrated in FIG. 8C corresponds to the disclosure of FIG. 1C or 2C, to which reference is made to avoid reiteration.

In FIG. 8D holes 30 are generated to penetrate the conductive foil layer 50 and to expose portions of the second main surfaces of 2b of the semiconductor chips 2, e.g., chip electrodes located under the holes 30. Reference is made to the description in conjunction with FIG. 7A to avoid reiteration.

Figure 7D:
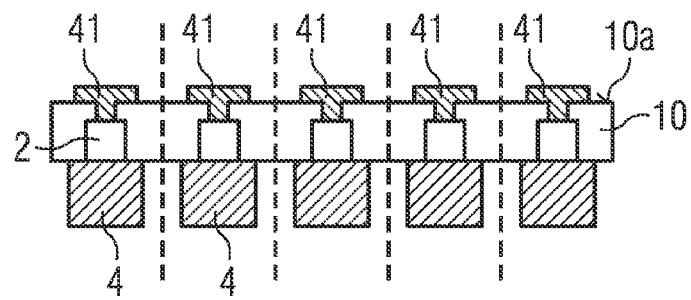

In FIG. 8E the holes 30 are filled with a conducting material 60. Hole filling may be accomplished by any of the methods described above in conjunction with FIGS. 7B and 7C. The conducting material 60 is arranged to make electrical contact with the conductive foil layer 50. Further, not shown in FIG. 8E, the conducting material 60 applied to fill the holes 30 and/or the conductive foil layer 50 may be structured to generate device electrodes 41 as depicted in FIG. 7D. Device electrodes 41 may represent the outer terminals of the semiconductor device which may be used to connect the semiconductor device to other applications or external devices such as, e.g., an external circuitry provided on a PCB to which the semiconductor device described herein is to be mounted.

FIG. 8F illustrates by way of example the singulation of the arrangement shown in FIG. 8E into single semiconductor devices in accordance with one embodiment. For further details reference is made to the above description, in particular in view of FIGS. 1D, 2E, and 7D.

FIGS. 9A-14 exemplifies stages of manufacturing a semiconductor device in accordance with one embodiment. The disclosure below is, in some aspects, more detailed than the disclosure of the aforementioned embodiments. It is to be noted that details described in connection with FIGS. 9A-14 may be combined with the concepts and aspects described in the aforementioned embodiments. Vice versa, concepts and aspects disclosed in relation to the aforementioned embodiments may be combined with the disclosure of the embodiments explained with reference to FIGS. 9A-14.

FIG. 9A schematically illustrates a leadframe 400. The leadframe 400 is a specific example of the device carrier 4. In this case, the multi-device carrier 3 is formed by at least one row or array of leadframes 400. A row of leadframes 400 extends in a direction indicated by arrows P.

The leadframe 400 is illustrated in a plan view (FIG. 9A), a cross-sectional view along the line A-A' (FIG. 9B) and a cross-sectional view along the line B-B' (FIG. 9C). The leadframe 400 may include a die pad 401, a first lead 402, a second lead 403 and a third lead 404. The leads 402-404 protrude essentially in parallel from one side of the die pad 401. The second lead 403 may be continuous with one side of the die pad 401. The die pad 401 and the leads 402-404 may be linked by dams (tie bars), which are not illustrated in the figures for the sake of clarity. As illustrated in FIGS. 9B and 9C, the leads 102-104 may optionally be arranged in a different plane than the die pad 401, but may alternatively be arranged in the same plane.

In one embodiment the leadframe 400 may be plated with an electrically conductive material, for example, copper, silver, iron, nickel or nickel-phosphorous. The leadframe 400 may have a thickness in the range from 100 µm to 1 mm or may be even thicker. The leadframe 400 may have been manufactured by punching, milling or stamping a metallic plate.

FIG. 10B schematically illustrates a semiconductor chip 2 which is a power semiconductor chip and is placed on the die pad 401. In one embodiment further power semiconductor chips may be placed on the same die pad 401 or on further die pads of the leadframe 400, which are not illustrated in FIG. 10B.

As shown in FIG. 10A, the semiconductor chip 2 is placed on the die pad 401 with its first main surface 2a facing the die pad 401 and its second main surface 2b facing and adhering to the adhesive foil 1. The semiconductor chip 2 may have a first electrode 23 on the first main surface 2a and a second electrode 25 on the second main surface 2b. The first and second electrodes 23, 25 are load electrodes. Furthermore, the semiconductor chip 2 may have a third electrode 26 on its second main surface 2b. The third electrode 26 may be a control electrode. The top surface of the die pad 401 may be larger than the first surface 2a of the semiconductor chip 2.

The semiconductor chip 2 may be configured as a power transistor, for example, a power MOSFET, IGBT, JFET or power bipolar transistor, or a power diode. In the case of a power MOSFET or JFET, the first electrode 23 is a drain electrode, the second electrode 25 is a source electrode, and the third electrode 26 is gate electrode. During operation, voltages higher than 5, 50, 100, 500 or 1000 V may be applied between the first and second electrodes 23, 25.

As shown in FIG. 10A, prior to the lamination process, a deposit of bonding substance 22 covers the first electrode 23. As described previously, the deposit of bonding substance 22 may, e.g., be a solder material, more particularly a diffusion solder material, or a paste or solvent including metal particles to be sintered.

For producing the bonding connection 22b, the leadframe 400 may be heated by a hot plate to a temperature above the transition temperature of the deposit of bonding substance 22. For example, the leadframe 400 may, e.g., be heated to a temperature in the range of 150° C. to 250° C., more particularly between 160° C. and 200° C. In one embodiment the leadframes 400 and the adhesive foil 1 together with the semiconductor chips 2 are placed in an oven or in a heatable press and are heated to an appropriate temperature. As described above, at a transition temperature the deposit of bonding substance 22 will react and will electrically and mechanically couple the die pad 401 to the first electrode 23 of the semiconductor chip 2. At another temperature, which may be higher than the transition temperature, the adhesive foil 1 may fuse and liquefy and provide the encapsulation material for covering at least parts of the semiconductor chip 2 and parts of the leadframe 400. By way of example, the encapsulation material may cover the second main surface 2b and side walls of the semiconductor chip 2, portions of the upper surface of the die pad 401 extending outwards the outline of the semiconductor chip 2 and inner portions of the leads 402, 403 and 404.

In FIG. 12A first holes 30a and second holes 30b are generated in the upper surface 10a of the encapsulant 10. Reference is made to the disclosure of aforementioned embodiments.

FIG. 12B schematically illustrates a top view of the arrangement shown in FIG. 12A wherein an exposed portion 25a of the second electrode and an exposed portion 402a of the first lead 402 are illustrated.

In FIG. 13 the first and second holes 30a, 30b are filled with a conductive layer 40. To avoid reiteration, reference is made to embodiments explained above.

In FIG. 14 the conductive layer 40 may be structured to form clips or bridges 41. In one embodiment the clips or bridges 41 may be used as device electrodes and/or heat sinks. In one embodiment the leads 402, 403, 404 may be used as device electrodes (device terminals).

In a subsequent step the plurality of semiconductor devices may be separated as exemplified, e.g., in FIG. 7D. Note that the corresponding cutting lines are not apparent in FIG. 14 because the cross-sectional side view of FIG. 14 corresponds to a view from the right or left hand side on the structure shown in FIG. 7D.

Chip bonding and/or adhesive foil lamination may each be accomplished by a semi-continuous process, e.g. by one and the same semi-continuous process or by different semi-continuous processes. By way of example, a reel-to-reel process as illustrated in FIG. 15 may be used. The pick-and-place process may be accomplished in a pick-and-place station S1. The lamination process and the semiconductor chip bonding process may both be accomplished at a lamination and bonding station S2. Here, by way of example, the lamination process and the bonding process are accomplished in the same station S2, and the same number of semiconductor chips 2 are subjected in parallel to these two processes. However, depending on the bonding substance transition temperature and on the adhesive foil melting temperature, these processes may also be accomplished in different stations and a different number of semiconductor chips may be subjected to these two processes in a sequential manner. The pick-and-place station S1 may be operated by using a continuous pick-and-place process or a semi-continuous pick-and-place process.

FIG. 16 illustrates semiconductor chips 2 bonded simultaneously in the lamination and bonding station S2 on a multi-device carrier 3 such as, e.g., leadframes. The encapsulant 10 is not depicted (i.e., assumed to be transparent). More than a thousand or several thousand semiconductor chips may be simultaneously bonded to the multi-device carrier 3 and may be simultaneously accommodated in the encapsulant 10 if the lamination process is accomplished concurrently with the bonding process. By way of example, SOT 223 packages may be manufactured that way.

It is to be noted that a reel-to-reel process is not mandatory for the semi-continuous operation described herein. In accordance with another embodiment, separate sheets of adhesive foils 1 with semiconductor chips 2 adhered thereto and separate sheets of device carriers 3 (e.g., of leadframes) as illustrated in FIG. 16 may be combined, respectively, and may be processed e.g., in groups in lamination and/or bonding station(s) such as, e.g., S2.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing semiconductor devices, the method comprising:
   placing a plurality of semiconductor chips on an adhesive foil, wherein a second main surface of each semiconductor chip faces the adhesive foil;
   placing the adhesive foil on a multi-device carrier, such that a first main surface of each semiconductor chip faces the multi-device carrier;
   laminating the adhesive foil over the multi-device carrier thereby forming an encapsulant encapsulating the plurality of semiconductor chips; and
   separating the multi-device carrier and the encapsulant thereby forming the semiconductor devices.

2. The method of claim 1, further comprising:
   electrically connecting each semiconductor chip of the plurality of semiconductor chips to the multi-device carrier when encapsulating the plurality of semiconductor chips.

3. The method of claim 2, wherein electrically connecting the plurality of semiconductor chips to the multi-device carrier comprises diffusion soldering or sintering.

4. The method of claim 1, further comprising:
   applying heat while laminating the adhesive foil over the multi-device carrier.

5. The method of claim 4, wherein the adhesive foil is heated to a temperature between 150° C. and 250° C.

6. The method of claim 1, further comprising:
   applying pressure when laminating the adhesive foil over the multi-device carrier.

7. The method of claim 1, further comprising:
   forming a hole in the encapsulant; and
   filling the hole with an electrically conducting material thereby forming an electrical contact to a chip electrode of a semiconductor chip of the plurality of semiconductor chips.

8. The method of claim 1, further comprising:
   structuring a conductive layer extending at a first surface of the encapsulant, which is opposite to a second surface of the encapsulant, that faces the plurality of semiconductor chips.

9. The method of claim 1, further comprising:
   transferring the adhesive foil with the plurality of semiconductor chips adhering to the adhesive foil from a first station where the plurality of semiconductor chips have been placed on the adhesive foil to a second station where the adhesive foil and the plurality of semiconductor chips are placed on the multi-device carrier.

10. The method of claim 9, wherein the adhesive foil is configured to be used as a conveyor belt, and wherein the adhesive foil is advanced in a reel-to-reel process from the first station to the second station.

11. The method of claim 1, wherein each of the semiconductor chips of the plurality of semiconductor chips has a chip electrode on the first main surface.

12. The method of claim 1, wherein each of the semiconductor chips of the plurality of semiconductor chips has a chip electrode on the second main surface.

13. The method of claim 1, wherein the multi-device carrier is one of a leadframe, a direct copper bond, and a printed circuit board.

14. The method of claim 1, wherein the adhesive foil comprises a polymer of a B-stage material.

15. The method of claim 1, wherein the adhesive foil comprises a material made of one or more of epoxy, acrylate, polyimide, PEEK, PPS, PSU, PEI, PAI and LCP.

16. The method of claim 1, wherein the adhesive foil comprises a conductive layer extending at a first surface of the adhesive foil, which is opposite to a second surface of the adhesive foil, that faces the plurality of semiconductor chips.

17. The method of claim 1, further comprising encapsulating the plurality of semiconductor chips with a further encapsulation material.

18. A method of manufacturing a semiconductor device, the method comprising:
   adhering a plurality of semiconductor chips to a transfer foil;
   placing the plurality of semiconductor chips adhered to the transfer foil over a multi-device carrier; and
   applying heat to laminate the transfer foil over the multi-device carrier, thereby accommodating the plurality of semiconductor chips between the laminated transfer foil and the multi-device carrier.

19. The method of claim 18, further comprising:
   electrically connecting the plurality of semiconductor chips to the multi-device carrier while applying the heat.

20. The method of claim 18, further comprising:
   after placing the plurality of semiconductor chips on the transfer foil at a first station, moving the transfer foil to a second station where the heat is applied.

21. A method of manufacturing a semiconductor device, the method comprising:
   adhering a plurality of semiconductor chips to a transfer foil;

placing the plurality of semiconductor chips adhered to the transfer foil on a multi-device carrier; and covering a top surface and side surfaces of each semiconductor chip with the transfer foil thereby encapsulating the plurality of semiconductor chips.

22. The method of claim 21, wherein covering the top surface and side surfaces of each semiconductor chip with the transfer foil comprises applying heat to the transfer foil.

23. The method of claim 22, wherein covering the top surface and side surfaces of each semiconductor chip with the transfer foil further comprises applying pressure to the transfer foil.

24. The method of claim 21, wherein placing the plurality of semiconductor chips on the multi-device carrier comprises electrically connecting each semiconductor chip to the multi-device carrier.

25. The method of claim 24, wherein electrically connecting each semiconductor chip to the multi-device carrier and covering the top surface and side surface of each semiconductor chip with the transfer foil are carried out at substantially the same time.

\* \* \* \* \*